United States Patent
Stephelbauer et al.

(10) Patent No.: US 7,501,887 B2
(45) Date of Patent: Mar. 10, 2009

(54) CONTROLLABLE AMPLIFIER AND ITS USE

(75) Inventors: Carl Stephelbauer, Ennsdorf (AT); Manfred Haberl, Linz (AT)

(73) Assignee: Infineon Technologies AG, Munich (DE)

( * ) Notice: Subject to any disclaimer, the term of this patent is extended or adjusted under 35 U.S.C. 154(b) by 170 days.

(21) Appl. No.: 11/360,720

(22) Filed: Feb. 23, 2006

(65) Prior Publication Data

US 2006/0202752 A1   Sep. 14, 2006

(30) Foreign Application Priority Data

Feb. 24, 2005   (DE) ........................ 10 2005 008 507

(51) Int. Cl.
*H03F 1/14*   (2006.01)
*H03F 3/45*   (2006.01)

(52) U.S. Cl. .......................... 330/51; 330/254; 330/278

(58) Field of Classification Search ........................ None
See application file for complete search history.

(56) References Cited

U.S. PATENT DOCUMENTS

| | | | |
|---|---|---|---|
| 5,594,383 A * | 1/1997 | Tamba | 327/552 |
| 6,373,337 B1 | 4/2002 | Ganser | |
| 6,472,940 B1 * | 10/2002 | Behzad et al. | 330/279 |
| 7,116,949 B2 * | 10/2006 | Irie et al. | 455/118 |
| 7,151,409 B2 * | 12/2006 | Koen et al. | 330/254 |
| 2005/0174175 A1 | 8/2005 | Helgelmayer et al. | |
| 2006/0170495 A1 * | 8/2006 | Stephelbauer et al. | 330/254 |

FOREIGN PATENT DOCUMENTS

EP   1 067 679 A2   1/2001

* cited by examiner

*Primary Examiner*—Robert Pascal
*Assistant Examiner*—Alan Wong
(74) *Attorney, Agent, or Firm*—Eschweiler & Associates, LLC

(57) ABSTRACT

A controllable amplifier is disclosed. The amplifier includes two current paths which couple an input to an output of the controllable amplifier. Each current path has a respective transistor which is connected as source follower. One of the two current paths is designed to be controllable. It is thus possible to adjust the attenuation and hence the overall gain of the source/follower circuit as a function of a set value for the overall gain (CTRL). The circuit can be used as a variable gain amplifier (VGA), or as a programmable gain amplifier (PGA), in radio-frequency transmitters.

18 Claims, 3 Drawing Sheets

CONTROLLABLE AMPLIFIER AND ITS USE

REFERENCE TO RELATED APPLICATIONS

This application claims the benefit of the priority date of German application DE 10 2005 008 507.5, filed on Feb. 24, 2005, the contents of which are herein incorporated by reference in their entirety.

FIELD OF THE INVENTION

One or more aspects and/or embodiments of the present invention relate to a controllable amplifier, and to its use in a transmitting arrangement.

BACKGROUND OF THE INVENTION

It will be appreciated that controllable amplifiers are used inter alia as controllable radio-frequency amplifiers in transmitting arrangements in communication systems. By way of example, on the basis of the UMTS, Universal Mobile Telecommunication System, mobile radio standard it should be possible to vary output power over a relatively wide range of about 80 dB. Controllable-gain amplifiers are normally used for this purpose. A distinction is drawn between amplifiers such as these in which the overall gain can be adjusted in an analog form as a function of a control signal, which are normally referred to as variable gain amplifiers, VGA, and controllable amplifiers such as these whose gain level is programmable in discrete steps by means of a digital signal, which are referred to as programmable gain amplifiers, PGA.

Owing to the large proportion of mobile appliances in modern communication systems, it is desirable to provide controllable amplifiers with low power consumption and high efficiency.

A further requirement for controllable amplifiers for modern mobile radio systems is that the carrier suppression does not deteriorate when the gain factor, and thus the output power, of the transmitter are varied.

One particular aim is for the mean power consumption to be as low as possible over a predetermined statistical probability of occurrence of the output power level. This leads to a mobile terminal having increased standby and call times, with a constant battery capacity.

SUMMARY OF THE INVENTION

The following presents a simplified summary in order to provide a basic understanding of one or more aspects and/or embodiments of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

One or more aspects and/or embodiments of the present invention pertain to a controllable amplifier which has a low power consumption and which is suitable for use as a controllable-gain radio-frequency amplifier in a transmitter.

According to one or more aspects and/or embodiments of the present invention a controllable amplifier includes an input for supplying a radio-frequency signal which is to be amplified, a control input for supplying a control signal for the desired overall gain, and an output for provision of an amplified signal. The amplifier also has a first current path which comprises a first transistor connected as a source follower, a second current path which comprises a second transistor connected as a source follower, with the second current path being connected in parallel with the first current path, and a means for controlling the second current path which means couples the control input of the controllable amplifier to the second transistor, where the input is connected to respective control inputs of the first and of the second transistors, and where the output is formed in a connecting node of the first and second current paths.

It will be appreciated that a transistor which is connected as a source follower or emitter follower is provided for amplification purposes. Connection of a transistor in this way is also referred to as a drain circuit or collector circuit, depending on the transistor type being used. The voltage gain of a transistor connected in this way is approximately unity. The overall gain can, however, nevertheless be controlled in a radio-frequency application, specifically by providing at least two current paths connected in parallel, which each comprise one transistor connected as a source follower. A means for controlling the at least one second current path is provided on it, and couples a control input to the second transistor in order to preset a desired overall gain level, and a desired output power from the controllable amplifier.

It will be appreciated that more than two current paths can be connected in parallel, in which case each current path would comprise one transistor connected as a source follower or emitter follower.

It will be appreciated that an amplifier as disclosed herein offers the capability to cover a wide dynamic range. Furthermore, the use of transistors as source followers allows the amplifier to be produced with high linearity.

Additionally, a controllable amplifier having at least two transistors connected as source followers has a high input impedance and a low output impedance. The overall gain is controlled by the means for controlling the second current path by variation of the gradient, or by partial cancellation by switching on source followers in antiphase, as will be explained in more detail in the following text.

The controllable amplifier may be balanced or in a single-ended form. In the case of a balanced version, designed for carrying differential signals, the input, the output and the current paths are designed to carry difference signals.

When at least two differential amplifiers which in turn each comprise two transistors connected as source followers are connected in antiphase, partial, mutual cancellation of the signal can be achieved by connection and disconnection of one differential amplifier. This allows a controllable overall gain to be achieved in a simple manner. If, by way of example, controllable resistors are used instead of switches, then not only is programmable amplification possible, but also amplification can be adjusted in an analog form.

As an alternative to adjustment of the gain by means of antiphase drive as explained, it is also possible to vary the gradient.

For example, this can be achieved by the means for controlling the second current path being formed by the second current path, and forming a series circuit with the second transistor. In this case, the means for controlling the second current path is in the form of a switch or a controllable resistor. This results in parallel-connected source followers being connected and disconnected, or controlled.

By way of example, if the source followers are formed by means of unipolar transistors, this is equivalent to variation of the channel-width to channel-length ratio of an effective transistor which represents the overall arrangement of the controllable amplifier. The gradient of the controllable amplifier is influenced in particular by variation of the channel width.

Alternatively or additionally, the means for controlling the second current path may comprise a controllable current source, with a control connection of the controllable current source which is coupled to the control input of the controllable amplifier. The connection and disconnection of additional current sources or the control of the magnitude of the current of an additional current source can also be referred to as off-gating in the amplifier, and likewise leads to the gradient and thus the output impedance being varied.

It can thus be appreciated that PGA functionality and VGA functionality can be provided with analog control of the overall gain, as well as select combinations. The provision of a desired number of parallel-connected source-follower branches and their design makes it possible to achieve virtually any desired amplifier dynamic range. In the PGA case, the step width can also be adjusted as required.

It will be appreciated that unipolar circuitry and/or field-effect transistors based on metal-oxide semiconductors, MOS circuitry, can be used in implementing one or more aspects and/or embodiments of the present invention.

The transistors, which are connected as source followers, in the individual current branches can be connected by their gate connections to the input for supplying a radio-frequency signal to be amplified. Depending on the arrangement, one connection of the controlled junctions is switchably, controllably or directly coupled to a supply potential connection. The other connection of the controlled junction of the source-follower transistors can be connected to the output for provision of the amplified signal. The output is connected to a reference-ground potential connection via at least one and possibly further controllable and/or switchable current sources. The control signal which is used to preset the desired overall gain can be used to drive one or more controllable or switchable current sources at the base point of the arrangement, or control means in series with the source-follower transistors.

It will be appreciated that a controllable amplifier as described herein can be provided in a transmitting arrangement in order to amplify a radio-frequency transmission signal.

In particular, when a baseband chip produces an analog control voltage for the overall gain for power adjustment, it may be desirable for the gain of the controllable amplifier to be adjustable in an analog form.

This mitigates or eliminates interference signals that can occur in the spectrum, such as those which can occur as a result of switching processes in the case of PGAs. This is particularly advantageous in the case of mobile radio methods which operate continuously, such as CDMA, Code Division Multiple Access. A multiple access method such as this is used in UMTS systems. Accordingly, high accuracy can be achieved, particularly with regard to VGA, when adjusting the overall gain, without having to carry out complex calibration routines.

BRIEF DESCRIPTION OF THE DRAWINGS

The invention is explained in more detail below wherein reference is made to the following drawings.

DETAILED DESCRIPTION OF THE INVENTION

Figure 1:
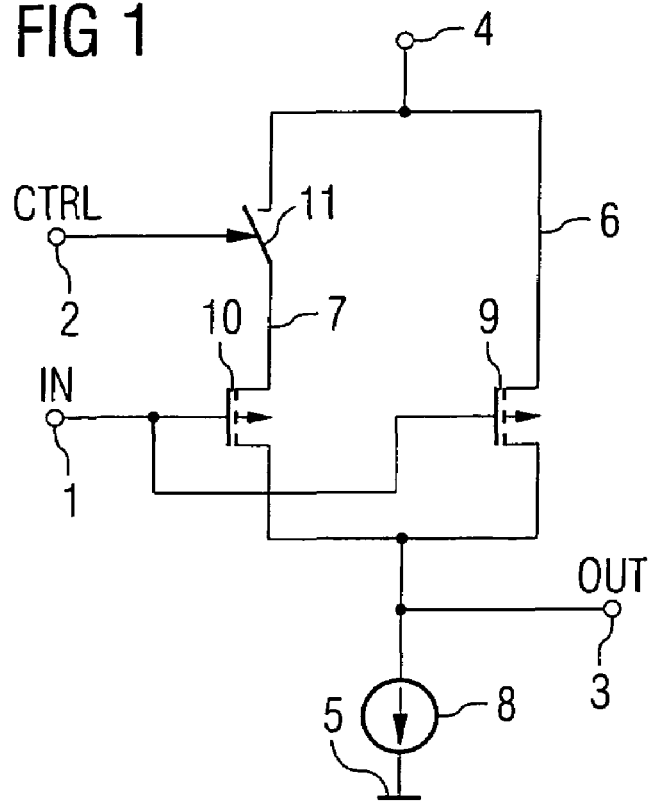
FIG. 1 is a schematic block diagram illustrating a controllable amplifier according to one or more aspects and/or embodiments of the present invention.

One or more aspects or embodiments of the present invention will now be described with reference to the drawing figures, wherein like reference numerals are used to refer to like elements throughout. It should be understood that the drawing figures and following descriptions are merely illustrative and that they should not be taken in a limiting sense. In the following description, for purposes of explanation, numerous specific details are set forth in order to provide a thorough understanding. It will be appreciated that variations of the illustrated systems and methods apart from those illustrated and described herein may exist and that such variations are deemed as falling within the scope of the present invention and the appended claims.

Turning to FIG. 1 a controllable amplifier is illustrated with an input 1 for supplying a radio-frequency signal IN to be amplified, and with a control input 2 for supplying a control signal CTRL in order to preset a desired overall gain for the controllable amplifier. An output 3 is designed to provide an amplified signal OUT, which is formed as a function of the supplied radio-frequency signal IN to be amplified and the control signal for the desired overall gain CTRL. Two current paths 6, 7 are formed between a supply potential connection 4 and a reference-ground potential connection 5. The current paths 6, 7 are connected in parallel between the supply potential connection 4 and a common current source 8, with the current source 8 being connected by its free connection to the reference-ground potential connection 5. Each of the current paths 6, 7 comprises a transistor which is connected as a source follower. The first current path 6 thus comprises a first transistor 9, which is connected as a source follower and has a control input and a controlled junction. The control input of the first transistor 9 is connected to the input 1. One connection of the controlled junction of the first transistor 9 is connected to the supply potential connection 4, while the other connection of the controlled junction is connected to the current source 8 and to the output 3. The second current path comprises the second transistor 10, which is connected as a source follower and likewise has a control input and a controlled junction. The control input of the second transistor 10 is likewise connected to the input 1. One connection of the controlled junction of the second transistor 10 is connected to the current source 8, to the output 3 and to a connection of the controlled junction of the first transistor 9. A free connection of the controlled junction of the second transistor 10 in the second current path 7 is connected to the supply potential connection 4 via a switch 11. A control connection of the switch 11 is coupled to the control input 2 of the controllable amplifier.

The circuit shown in FIG. 1 uses unipolar circuitry. By way of example, the switch 11 may likewise be in the form of a field-effect transistor. Normally-off MOS field-effect transistors of the p-channel type can be used for the transistors 9, 10 which are connected as source followers, although other transistors can also be provided.

The connection of the second current path 7 changes the effective channel-width to channel-length ratio. Reducing the channel width reduces the gradient of the overall amplifier, while the gradient is increased by enlarging the channel width. In the circuit shown in FIG. 1, the power consumption is reduced as the attenuation increases.

Attenuation can be achieved by deliberately reducing the output impedance of the source follower in conjunction with the input impedance of the stage following it. Switching of the active source-follower stages by means of the switch 11 can be carried out by digital driving in the PGA mode, or alternatively by analog driving in the VGA mode, for example, with the switch 11 being in the form of a controllable resistor.

A switch, which is closed, can likewise be provided in the first current path 6 between the supply potential connection 4 and the controlled junction of the first transistor 9 in order to improve the balance characteristics of the circuit.

Figure 2:
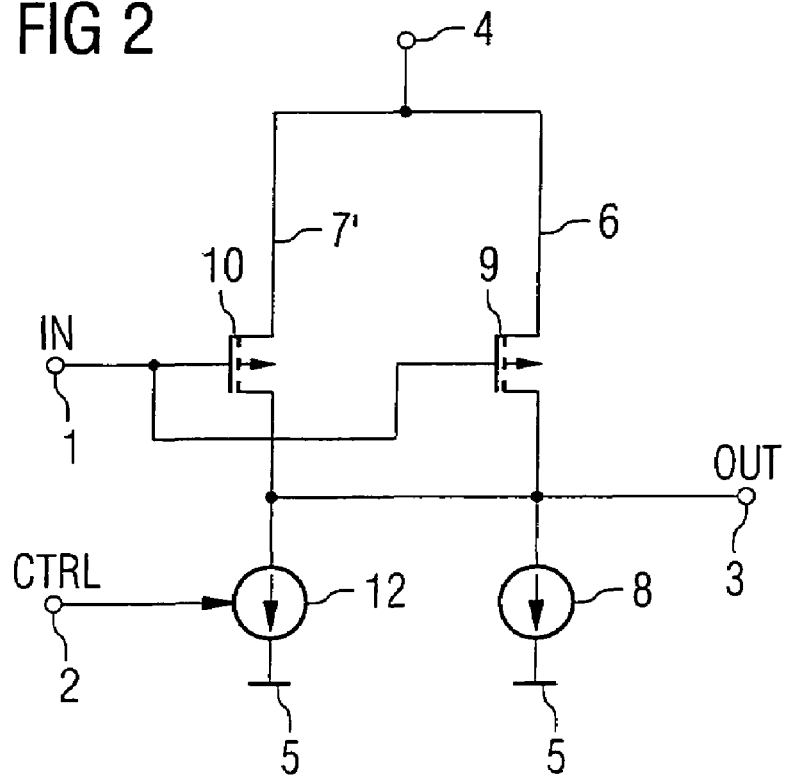
FIG. 2 is another schematic block diagram illustrating a controllable amplifier according to one or more aspects and/or embodiments of the present invention.

FIG. 2 illustrates an alternative to the controllable amplifier depicted in FIG. 1. In FIG. 2 switch 11 is replaced by transistor 10 connected directly to the supply potential connection 4. A controlled current source 12 is provided in FIG. 2, which connects the output 3 and thus the base point of the two transistors 9, 10 to the reference-ground potential connection 5. This additional, second current source 12 is thus connected in parallel with the first current source 8. The second current source 12 is designed to be controllable and has a control input which is connected to the control input of the controllable amplifier 2 in order to supply the analog control signal CTRL.

The channel-width to channel-length ratio is not varied in FIG. 2 by disconnection of parallel-connected source followers, but instead the gradient of the overall amplifier is varied by means of so-called off-gating by means of the second current source 12. The attenuation is achieved in a controllable manner as a function of the control signal CTRL by deliberately reducing the output impedance of the source follower in conjunction with the input impedance of a downstream stage at the output 3. The switching of the current of the current source 12 or the analog proportional control of the current which is provided by the current source 12 can be carried out either by digital driving in the PGA mode or by analog driving in the VGA mode.

It will be appreicaited that power consumption is reduced as attenuation increases in FIG. 2.

It will be appredated that the circuits illustrated in FIGS. 1 and 2 may also be designed with more than two stages. For example, in the case of the arrangement shown in FIG. 1, further current paths can be provided with further switches, and in the case of the arrangement shown in FIG. 2, further controlled current sources can be provided.

The circuits shown in FIGS. 1 and 2 are also combinable in a single controllable amplifier.

Figure 3:
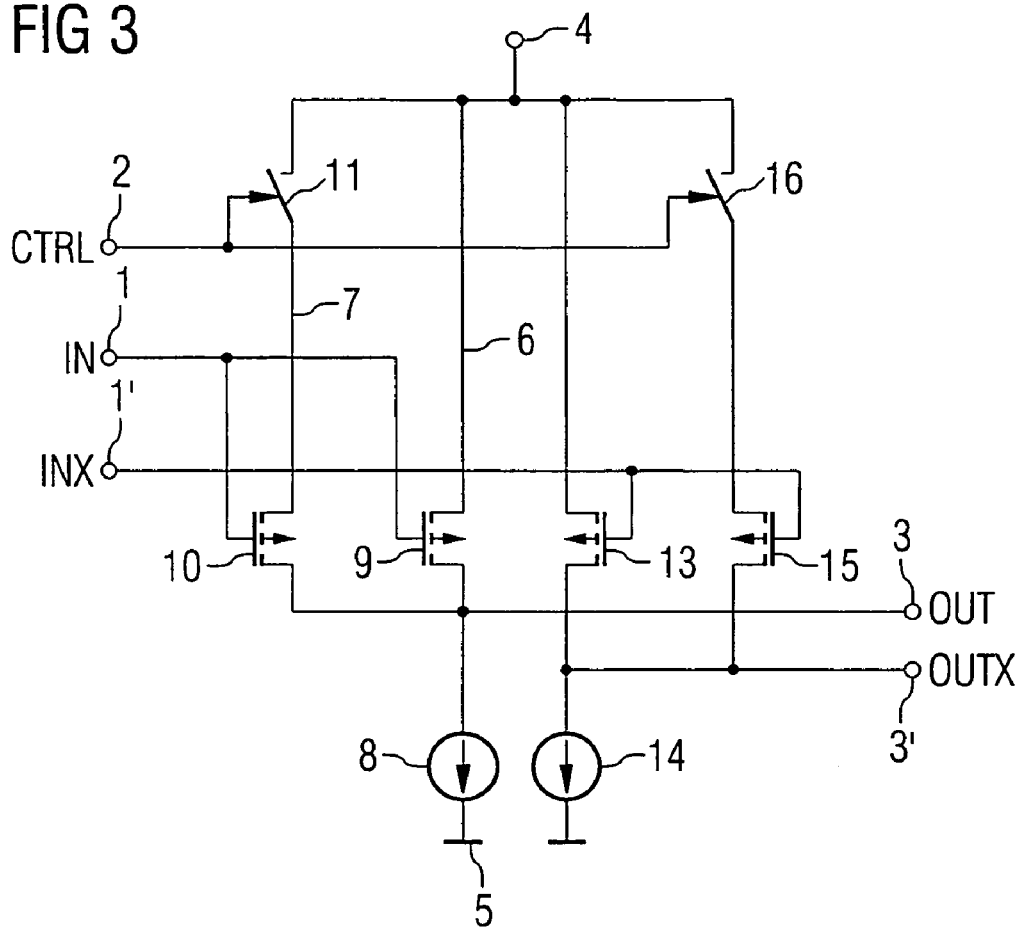
FIG. 3 is another schematic block diagram illustrating a controllable amplifier as in FIG. 1, but using balanced circuitry.

FIG. 3 illustates a circuit similar to that illusrated in FIG. 1, but is balanced to carry differential signals. To this end, the inputs 1, 1' in the same way as the outputs 3, 3' are designed to have two connections to carry differential signals. The first transistor 9 together with a further first transistor 13 forms a first differential amplifier with a common connection node in the supply potential connection 4. The control input of the first transistor 9 is connected to a first connection 1 of the input, and the controlled input of the further first transistor 13 is connected to a second connection 1' of the input of the controllable amplifier. The controlled junction of the further first transistor 13 is connected between the supply potential connection 4 and a connection 3' of the balanced output 3, 3'. This connection 3' is connected via a further current source 14 to the reference-ground potential connection 5. In the same way, the second transistor 10, which is connected as a source follower, has a further associated second transistor 15, which is likewise connected in the same way as the further first transistor 13 as a source follower. The further second transistor 15 together with the second transistor 10 forms a switchable differential amplifier. For this purpose, the control input of the further second transistor 15 is connected to the control input of the further first transistor 13. The controlled junction of the further second transistor 15 connects the further connection 3' of the output 3, 3' to the supply potential connection 4 via a further switch 16. The controlled junction of the further second transistor 15 and the further switch 16 accordingly form a series circuit. The control input of the further switch 16 is connected to the control input of the switch 11, so that switches 11 and 16 are operated concurrently.

Figure 4:
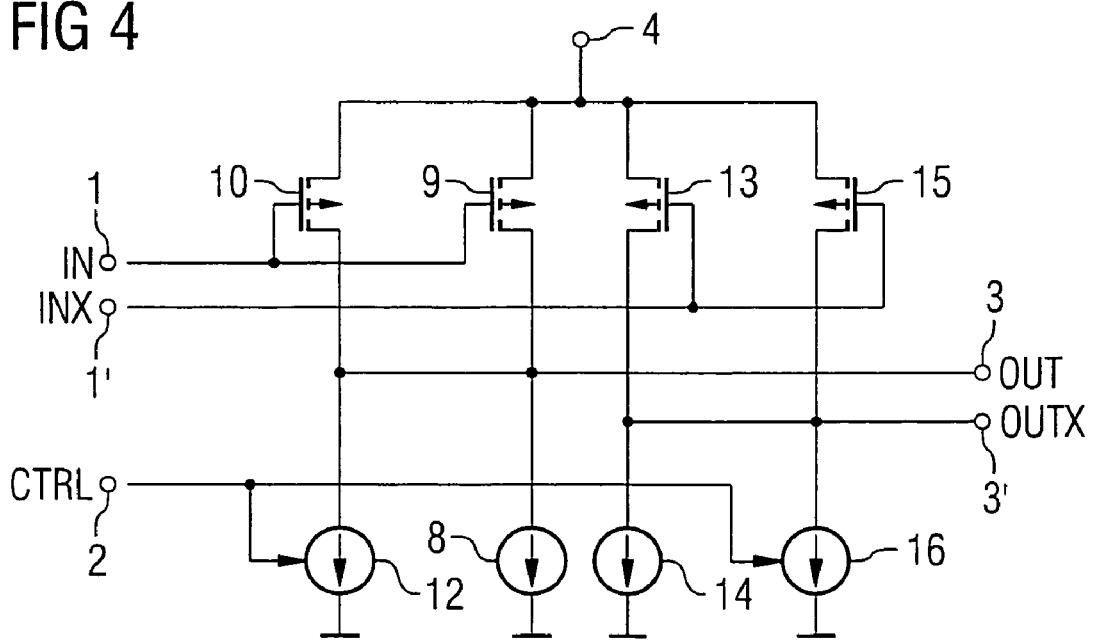
FIG. 4 is another schematic block diagram illustrating a controllable amplifier as in FIG. 2, but using balanced circuitry.

Turning to FIG. 4 another exemplary circuit is illustrated according to one or more aspects and/or embodiments of the present invention. The circuit in FIG. 4 is similar to that depicted in FIG. 2 in that it makes use of controlled current sources, but is balanced as in FIG. 3. In FIG. 4, all of the transistors 9, 10, 13, 15 which are connected as source followers are connected by one connection directly to the supply potential connection 4. Accordingly, the two switches 11, 16 are not needed, and they are replaced by fixed connections. In order to switch the overall gain and/or to control the gain level, two second current sources 12, 16 are provided in addition to the two first current sources 8, 14 included in FIG. 3. The two second current sources 12, 16 are designed to be controllable. One of the two second current sources 12 is connected in parallel with the current source 8. The further second current source 16 is connected in parallel with the further first current source 14. The two second current sources 12, 16 each have one control input, which is connected to the control input 2 of the controllable amplifier. The current sources 12, 16 are either designed such that they can be connected and disconnected or have means for production of a current which is proportional to a control signal. Either a PGA function or a VGA function, or a combination of them is thus achieved. With regard to the method of operation of the circuit shown in FIG. 4, in terms of the controlled current sources, reference should be made to the functional description relating to FIG. 2, in order to avoid repetitions.

Figure 5:
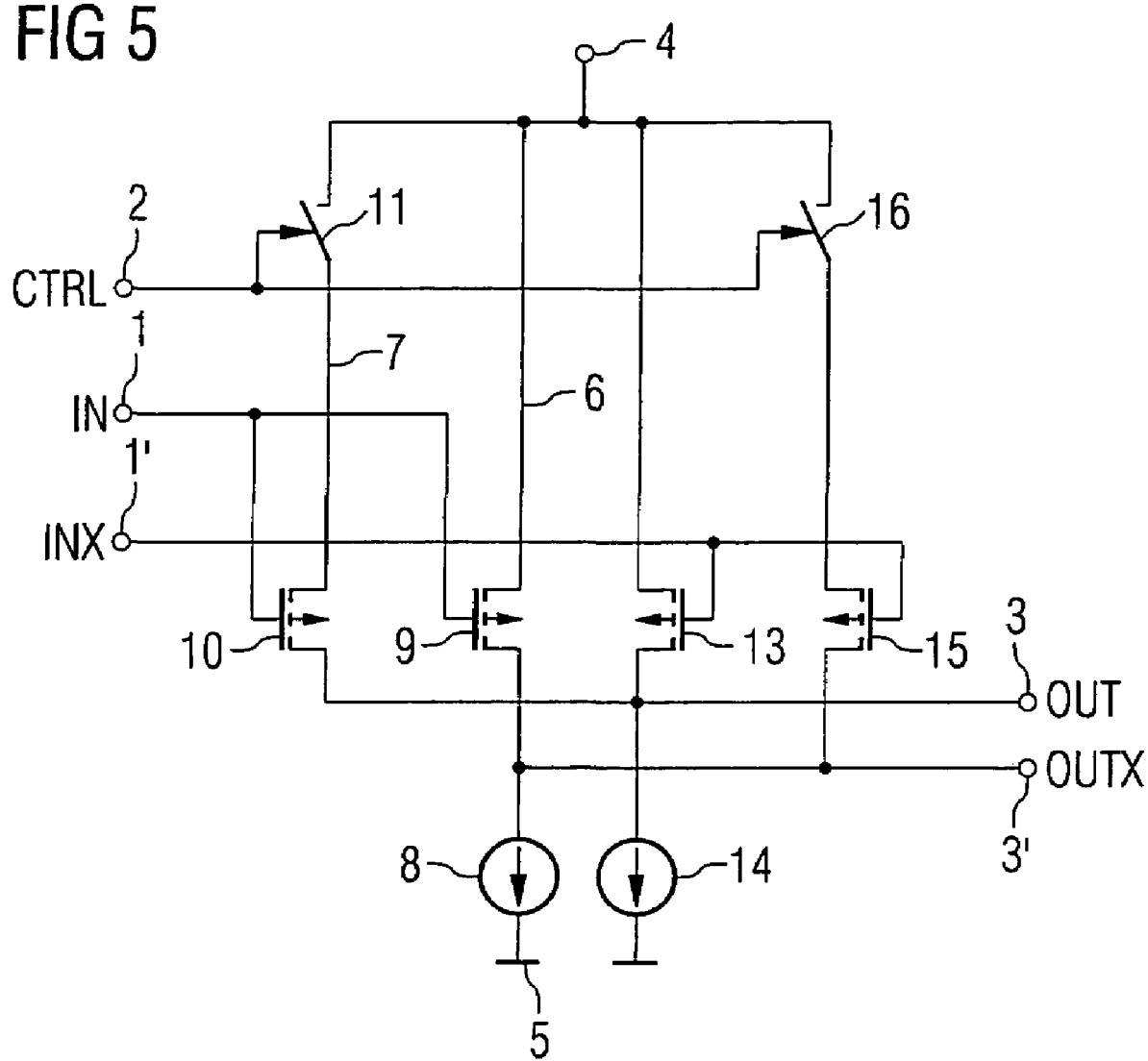
FIG. 5 is another schematic block diagram illustrating a controllable amplifier with antiphase drive according to one or more aspects and/or embodiments of the present invention.

FIG. 5 illustrates an exemplary controllable amplifier, which operates via differential cancellation, specifically by connection of source followers which are connected in antiphase. The circuit in FIG. 5 is similar to that illustrated in FIG. 3, however, the differential amplifiers with the transistors 9, 13 and 10, 15, respectively, are not connected in parallel. Instead, the differential amplifiers 9, 13; 10, 15 are cross-coupled in the output 3, 3', so that their outputs operate in antiphase to one another.

One connection of the controlled junction of the first transistor 9 is not connected to one connection of the controlled junction of the transistor 10 but to a connection of the controlled junction of the transistor 15. Similarly, one connection of the controlled junction of the second transistor 13 is not connected to one connection of the further second transistor 15 but to a connection of the controlled junction of the further first transistor 10.

In the circuit in FIG. 5, the gradient is not varied in order to control the overall gain, as in the case of the circuits shown in FIGS. 1 to 4, but partial differential cancellation of the output currents is carried out, as a function of the control signal CTRL, by antiphase operation of the source followers. The differential signals in the output 3, 3' are combined in a controlled form such that they are partially cancelled out. The switching of the antiphase source-follower stages via the switches 11, 16 can be carried out either in a digital form to provide a PGA function, or in an analog form to provide a VGA function. In comparison to the circuits illustrated in FIGS. 1 to 4, in the example illustrated in FIG. 5 the maximum achievable attenuation does not depend on the input impedance of a downstream stage connected to the output 3, 3'. Rather, the maximum achievable attenuation depends on the scaling ratio between the in-phase and antiphase source-follower stage.

It will be appreciated that if there are more than two stages, a control device may be connected between the control input 2 and the control connections of the switches or controlled resistors 11, 16, or of the controlled current sources 12, 16, to convert the control signal to a suitable drive for the current sources or switches.

Although the invention has been illustrated and described with respect to a certain aspect or various aspects, it is obvious that equivalent alterations and modifications will occur to others skilled in the art upon the reading and understanding of this specification and the annexed drawings. In particular regard to the various functions performed by the above described components (e.g., assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising." Also, "exemplary" is merely intended to mean an example, rather than "the best".

LIST OF REFERENCE SYMBOLS

1 Input
1' Input
2 Control input
3 Output
3' Output
4 Supply potential connection
5 Reference-ground potential connection
6 Current path
7 Current path
8 Current source
9 Transistor
10 Transistor
11 Switch
12 Controlled current source
13 Transistor
14 Current source
15 Transistor
16 Controlled current source
CTRL Control signal
IN Input signal
INX Input signal
OUT Output signal
OUTX Output signal

The invention claimed is:

1. A controllable amplifier, comprising:
   an input for supplying a radio-frequency signal (IN) which is to be amplified;
   a control input for supplying a control signal for the desired overall gain (CTRL);
   an output for provision of an amplified signal (OUT);
   a first current path which comprises a first transistor connected as a source follower;
   a second current path which comprises a second transistor connected as a source follower, with the second current path being connected in parallel with the first current path; and
   means for controlling the second current path which couples the control input to the second transistor,
   where the input is connected to respective control inputs of the first and second transistors,
   where the output is formed in a connecting node of the first and second current paths, and
   where the first current path comprises a further first transistor, and the second current path comprises a further second transistor to form a differential amplifier in the first and second current paths, where the input is connected to respective control inputs of the further first and further second transistors.

2. The controllable amplifier of claim 1, wherein respective outputs of the first and second current paths are coupled to one another in antiphase.

3. The controllable amplifier of claim 2, wherein the means for controlling the second current path is formed by the second current path and forms a series circuit with the second transistor.

4. The controllable amplifier of claim 3, wherein the means for controlling the second current path comprises a controllable current source, with a control connection of the controllable current source coupled to the control input of the controllable amplifier.

5. The controllable amplifier of claim 3, wherein the means for controlling the second current path is designed to provide an analog control signal.

6. The controllable amplifier of claim 3, wherein the means for controlling the second current path is designed to provide a digital control signal.

7. The controllable amplifier of claim 3, wherein the amplifier is designed in an integrated form, using unipolar circuitry.

8. The controllable amplifier of claim 1, wherein the means for controlling the second current path is formed by the second current path and forms a series circuit with the second transistor.

9. The controllable amplifier of claim 1, wherein the means for controlling the second current path comprises a controllable current source, with a control connection of the controllable current source coupled to the control input of the controllable amplifier.

10. The controllable amplifier of claim 1, wherein the means for controlling the second current path is designed to provide an analog control signal.

11. The controllable amplifier of claim 1, wherein the means for controlling the second current path is designed to provide a digital control signal.

12. The controllable amplifier of claim 1, wherein the amplifier is designed in an integrated form, using unipolar circuitry.

13. The controllable amplifier of claim 1, wherein the amplifier is implemented as a controllable radio-frequency amplifier in a transmitting arrangement.

14. A controllable amplifier, comprising:
an input for supplying a radio-frequency signal (IN) which is to be amplified;
a control input for supplying a control signal for the desired overall gain (CTRL);
an output for provision of an amplified signal (OUT);
a first current path which comprises a first transistor connected as a source follower;
a second current path which comprises a second transistor connected as a source follower, with the second current path being connected in parallel with the first current path; and
a controllable current source for controlling the second current path which couples the control input to the second transistor, where the controllable current source has a control connection coupled to the control input of the controllable amplifier,
where the input is connected to respective control inputs of the first and second transistors,
where the output is formed in a connecting node of the first and second current paths, and
where the first current path comprises a further first transistor, and the second current path comprises a further second transistor to form a differential amplifier in the first and second current paths, where the input is connected to respective control inputs of the further first and further second transistors.

15. The controllable amplifier of claim 14, wherein respective outputs of the first and second current paths are coupled to one another in antiphase.

16. The controllable amplifier of claim 14, wherein the controllable current source for controlling the second current path is designed to provide an analog control signal.

17. The controllable amplifier of claim 14, wherein the controllable current source for controlling the second current path is designed to provide a digital control signal.

18. A controllable amplifier, comprising:
an input for supplying a radio-frequency signal (IN) which is to be amplified;
a control input for supplying a control signal for the desired overall gain (CTRL);
an output for provision of an amplified signal (OUT);
a first current path which comprises a first transistor connected as a source follower;
a second current path which comprises a second transistor connected as a source follower, with the second current path being connected in parallel with the first current path; and
means for controlling the second current path which couples the control input to the second transistor,
where the input is connected to respective control inputs of the first and second transistors such that the control inputs of the first and second transistors receive the same potential, and
where the output is formed in a connecting node of the first and second current paths.

* * * * *